(12) United States Patent
Kim et al.

(10) Patent No.: US 10,460,820 B1
(45) Date of Patent: Oct. 29, 2019

(54) HIGH-SPEED TRACK-AND-HOLD DEVICE USING RF LINEARIZATION TECHNIQUE

(71) Applicant: INDUSTRY-ACADEMIC COOPERATION FOUNDATION, YONSEI UNIVERSITY, Seoul (KR)

(72) Inventors: Tae Wook Kim, Seoul (KR); Jun Young Jang, Incheon (KR)

(73) Assignee: INDUSTRY-ACADEMIC COOPERATION FOUNDATION, YONSEI UNIVERSITY, Seoul (KR)

(*) Notice: Subject to any disclaimer, the term of this patent is extended or adjusted under 35 U.S.C. 154(b) by 0 days.

(21) Appl. No.: 16/202,452

(22) Filed: Nov. 28, 2018

(30) Foreign Application Priority Data

Sep. 21, 2018 (KR) .................. 10-2018-0113911

(51) Int. Cl.
*G11C 27/02* (2006.01)
*H03G 1/00* (2006.01)

(52) U.S. Cl.
CPC ......... *G11C 27/026* (2013.01); *H03G 1/0088* (2013.01)

(58) Field of Classification Search
CPC combination set(s) only.
See application file for complete search history.

(56) References Cited

U.S. PATENT DOCUMENTS 5,734,276 A * 3/1998 Abdi .................. G11C 27/026
327/309
7,847,600 B2 * 12/2010 Leslie .................. G11C 27/02
327/91

FOREIGN PATENT DOCUMENTS

KR  10-2006-0054418 A   5/2006
KR     10-1245542 B1    3/2013

* cited by examiner

*Primary Examiner* — An T Luu
(74) *Attorney, Agent, or Firm* — Sughrue Mion, PLLC

(57) ABSTRACT

Disclosed is a high-speed track-and-hold device including a buffer stage circuit including a PMOS source follower and a post linear circuit, and a sampling stage circuit that is responsible for supplying a source voltage ($V_{SS}$) to the buffer stage circuit and that is arranged so that a switch connected to a gate is connected to the source voltage ($V_{SS}$) and the NMOS transistor of a sampling stage is turned off in hold operation.

5 Claims, 5 Drawing Sheets

110

120

130

HIGH-SPEED TRACK-AND-HOLD DEVICE USING RF LINEARIZATION TECHNIQUE

CROSS-REFERENCE TO RELATED APPLICATION

This application claims priority to Korean Patent Application No. 10-2018-0113911, filed on Sep. 21, 2018 in the Korean Intellectual Property Office, the disclosure of which is incorporated herein by reference.

BACKGROUND OF THE DISCLOSURE

Field of the Disclosure

The present disclosure relates to a high-speed track-and-hold device. More specifically, the present disclosure relates to a technical idea in which a buffer stage is configured with a PMOS-type source follower and an RF linearization technique (post linearization technique) is additionally applied to remove nonlinear characteristics from the buffer.

Description of the Related Art

As the widths and diversity of currently used frequency bands gradually increase, development of high-speed analog-to-digital converters (ADCs) capable of converting signals in these frequency bands into digital signals is also required. The most important component of these high-speed ADCs is a sampler that performs sampling of input signals at high speed.

FIG. 1A illustrates the structure of a track-and-hold amplifier 110 that is commonly used.

As shown in FIG. 1A, the track-and-hold amplifier 110 is a type of high-speed sampler and has the most widely used structure without distinguishing between BJT and MOSFET. In general, the track-and-hold amplifier 110 has a structure using a switched source follower.

FIG. 1B is a circuit diagram illustrating operation of the track-and-hold amplifier in a track mode.

As shown in FIG. 1B, when operating in a track mode, a source follower acts as a buffer for input signals, INn and INp, and a sampling capacitance (Sampling Cap) generates a voltage that tracks the input signals.

FIG. 1C is a circuit diagram illustrating operation of the track-and-hold amplifier in a hold mode.

When the track-and-hold amplifier is switched to the hold mode, a tail current source flows through a pre-amplifier (pre-amp) to generate resistance, so that the gate voltage of a source follower falls below the threshold value, thereby turning off the source follower. Accordingly, the voltage value stored in sampling is held unchanged.

Linearity performance is also important for restoring data transmitted according to various communication standards, but in the main structure, sampling rate is focused upon and linearity is lowered.

Typical reasons for this low linearity are as follows.

First, there may be a current leakage problem due to incomplete turning off of a source follower. Voltage values stored during transition from a track mode to a hold mode are changed by the current leakage, which causes signal distortion and degrades the quality of stored signals. In addition, hold-mode feedthrough in which a part of change in an input signal is transmitted to a sampling capacitor by a pre-amplifier which is not completely turned off in the hold state may be a problem.

Next, there may be a problem in the performance of a CS amplifier used as a buffer to prevent the previous stage from being affected by track-and-hold operation. The CS amplifier may be directly affected by a 3rd order harmonic due to the transconductance (Gm) of a transistor. Accordingly, the main structure has a low spurious-free dynamic range (SFDR: ADC linearity index) performance of 5 to 6 bits or less.

RELATED DOCUMENTS

Patent Documents

Korean Patent No. 1245542 "TRACK-AND-HOLD CIRCUIT AND TRACK-AND-HOLD METHOD"

Korean Patent Application Publication No. 2006-0054418 "TRACK-AND-HOLD CIRCUIT, ANALOG-TO-DIGITAL CONVERTER AND INTEGRATED CIRCUIT"

SUMMARY OF THE DISCLOSURE

Therefore, the present disclosure has been made in view of the above problems, and it is an object of the present disclosure to provide a track-and-hold device capable of performing sampling of input signals at high speed without distortion.

It is another object of the present disclosure to reduce the effect of transconductance (Gm) of a transistor generated due to feedback by a tail current source.

It is another object of the present disclosure to reduce the nonlinear effect of a buffer using a post-linearization technique.

It is another object of the present disclosure to provide a track-and-hold device, wherein, when the track-and-hold device is switched to a hold mode, a PMOS source follower may be completely turned off by blocking electric current, thereby preventing a problem of hold-mode feedthrough.

It is another object of the present disclosure to reduce signal distortion due to leakage current by connecting a switch connected to a gate to a source voltage ($V_{SS}$) in a sampling stage.

It is yet another object of the present disclosure to reduce distortion caused by parasitic capacitance through cross coupling using transistors of the same type as a capacitor.

In accordance with the present disclosure, the above and other objects can be accomplished by the provision of a high-speed track-and-hold device including a buffer stage circuit including a PMOS source follower and a post linear circuit, and a sampling stage circuit that is responsible for supplying a source voltage ($V_{SS}$) to the buffer stage circuit and that is arranged so that a switch connected to a gate is connected to the source voltage ($V_{SS}$) and the NMOS transistor of a sampling stage is turned off in hold operation.

The PMOS source follower according to one embodiment may block a tail current source fed back by track-and-hold operation by switching the tail current source.

The PMOS source follower according to one embodiment may act as a buffer for input signals INn and INp instead of a CS amplifier and may generate voltages corresponding to the input signals.

The post linear circuit according to one embodiment may include two different PMOS transistors each having a gate and a drain connected to each other and a resistor, thereby blocking nonlinear signals generated in an RF frequency band.

The high-speed track-and-hold device according to one embodiment may further include a cross-coupled circuit including transistors of the same type instead of a capacitor, wherein the cross-coupled circuit eliminates distortion caused by gate-source capacitance (Cgs).

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1A:
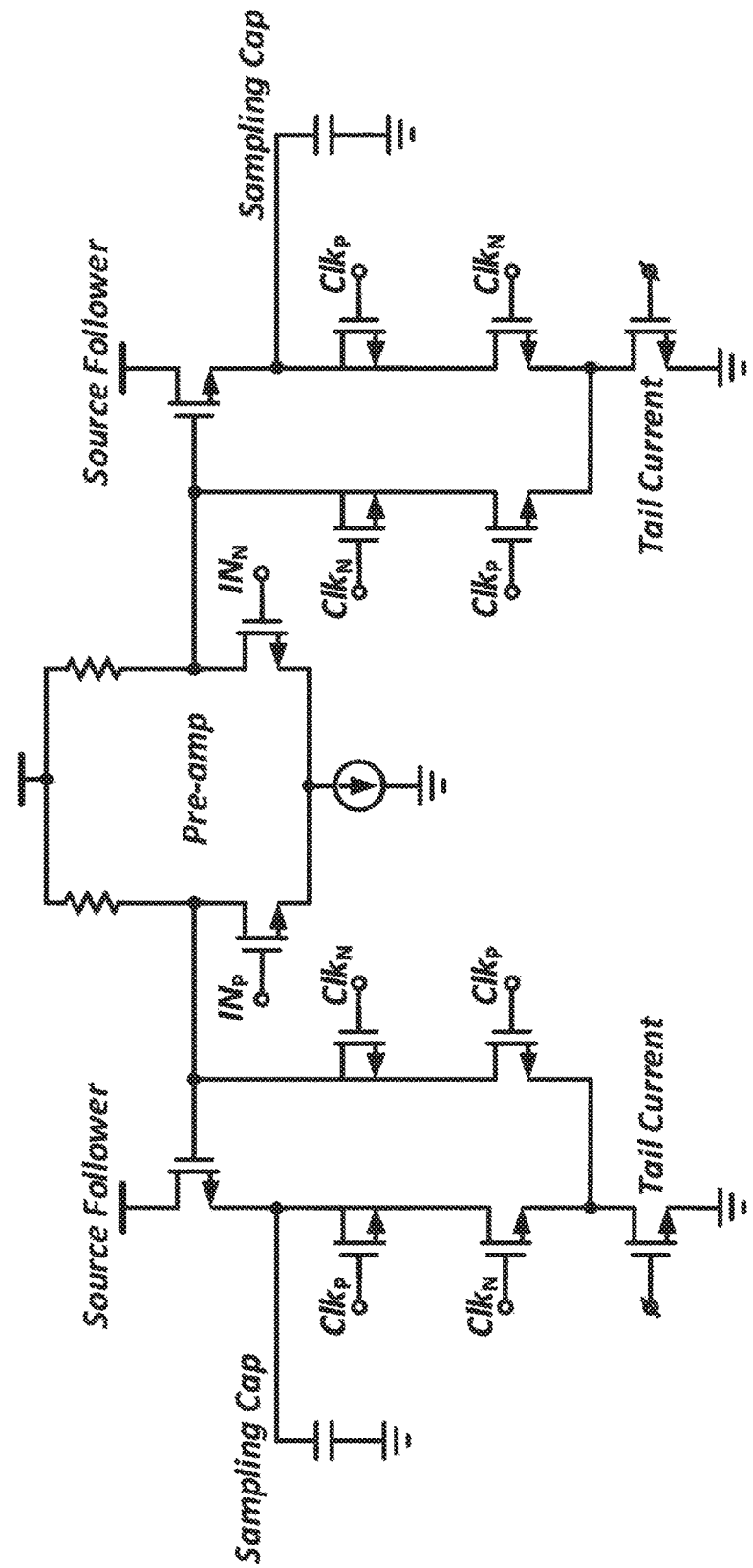
FIG. 1A illustrates the structure of a track-and-hold amplifier that is commonly used.
Figure 1B:
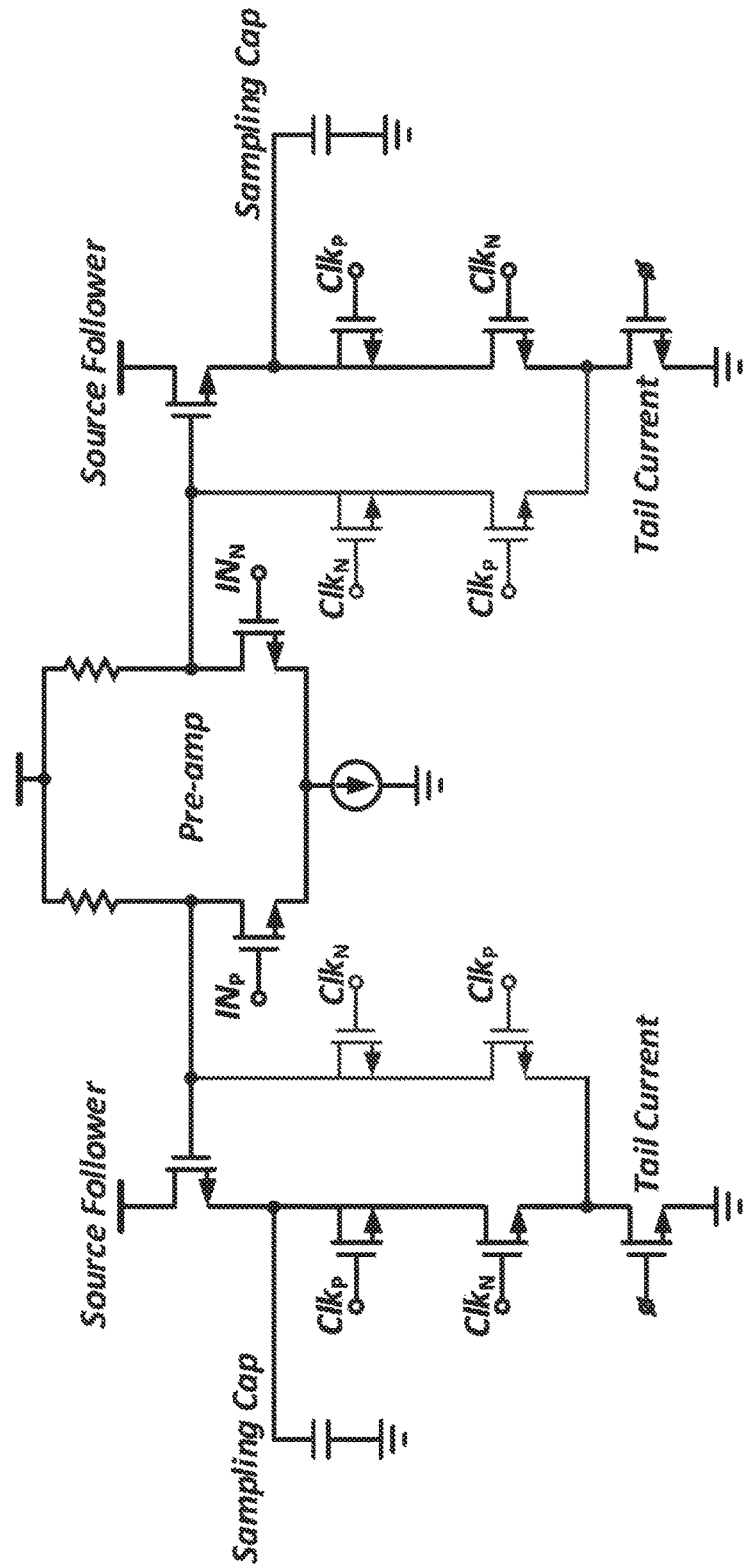
FIG. 1B is a circuit diagram illustrating operation of the track-and-hold amplifier in a track mode.
Figure 1C:
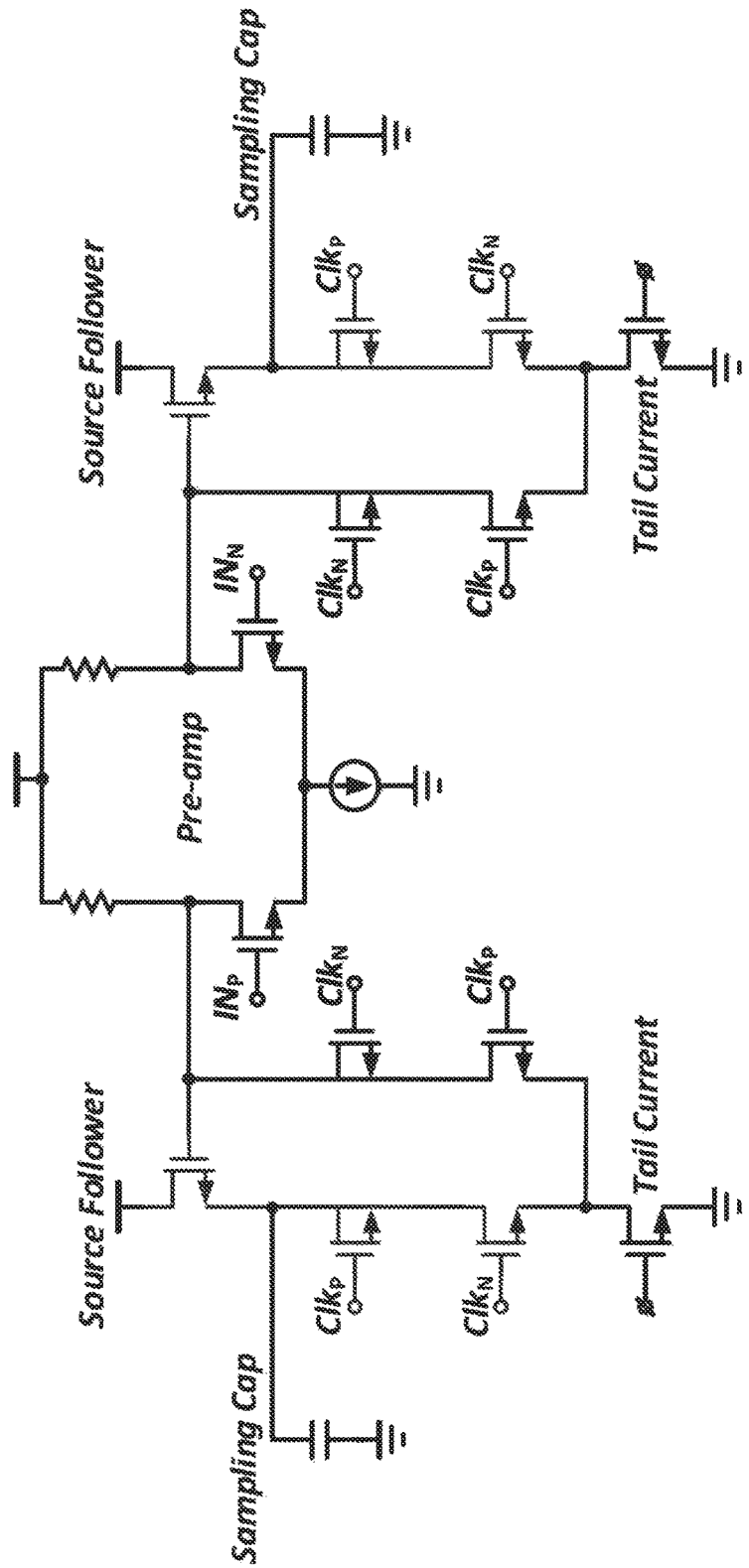
FIG. 1C is a circuit diagram illustrating operation of the track-and-hold amplifier in a hold mode.

Specific structural and functional descriptions of embodiments according to the concept of the present disclosure disclosed herein are merely illustrative for the purpose of explaining the embodiments according to the concept of the present disclosure. Furthermore, the embodiments according to the concept of the present disclosure can be implemented in various forms and the present disclosure is not limited to the embodiments described herein.

The embodiments according to the concept of the present disclosure may be implemented in various forms as various modifications may be made. The embodiments will be described in detail herein with reference to the drawings. However, it should be understood that the present disclosure is not limited to the embodiments according to the concept of the present disclosure, but includes changes, equivalents, or alternatives falling within the spirit and scope of the present disclosure.

The terms such as "first" and "second" are used herein merely to describe a variety of constituent elements, but the constituent elements are not limited by the terms. The terms are used only for the purpose of distinguishing one constituent element from another constituent element. For example, a first element may be termed a second element and a second element may be termed a first element without departing from the teachings of the present disclosure.

It should be understood that when an element is referred to as being "connected to" or "coupled to" another element, the element may be directly connected or coupled to the other element or intervening elements may be present. In contrast, when an element is referred to as being "directly connected to" or "directly coupled to" another element, there are no intervening elements present. Other words used to describe the relationship between elements should be interpreted in a like fashion (e.g., "between," versus "directly between," "adjacent," versus "directly adjacent," etc.).

The terms used in the present specification are used to explain a specific exemplary embodiment and not to limit the present inventive concept. Thus, the expression of singularity in the present specification includes the expression of plurality unless clearly specified otherwise in context. Also, terms such as "include" or "comprise" should be construed as denoting that a certain characteristic, number, step, operation, constituent element, component or a combination thereof exists and not as excluding the existence of or a possibility of an addition of one or more other characteristics, numbers, steps, operations, constituent elements, components or combinations thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, preferred embodiments of the present disclosure will be described in detail with reference to the accompanying drawings. However, the scope of the present disclosure is not limited by these embodiments. Like reference numerals in the drawings denote like elements.

Figure 2:
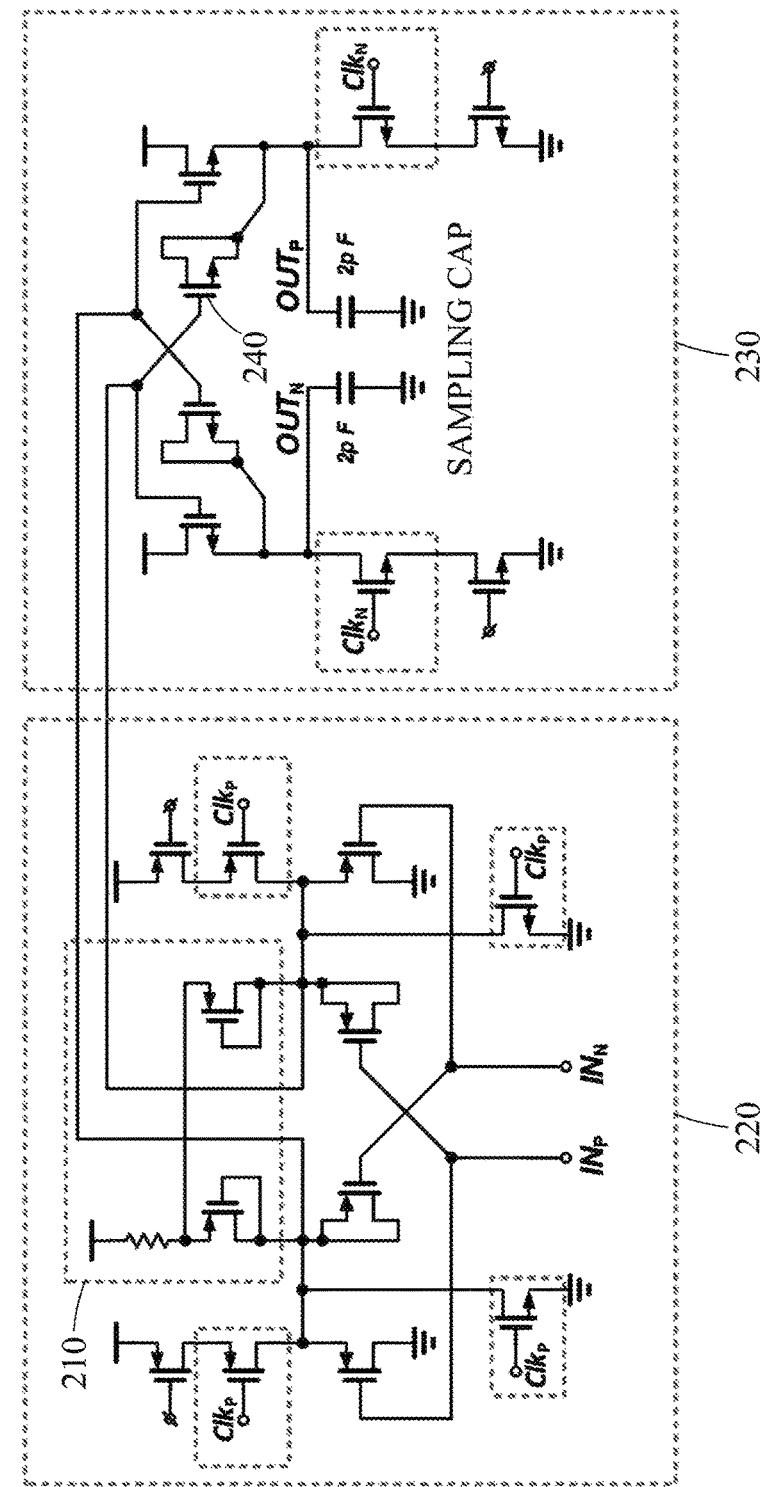
FIG. 2 is a circuit diagram for explaining a high-speed track-and-hold device according to one embodiment.

FIG. 2 is a circuit diagram for explaining a high-speed track-and-hold device 200 according to one embodiment.

The high-speed track-and-hold device 200 according to one embodiment may perform sampling of input signals at high speed without distortion.

To perform this operation, the high-speed track-and-hold device 200 according to one embodiment may include a buffer stage circuit 220 for a buffer stage and a sampling stage circuit 230 for a sampling stage.

First, the buffer stage circuit 220 may include a post linear circuit 210 to solve nonlinear problems that occur in a track mode in which the buffer stage circuit 220 operates as a buffer. In addition, the buffer stage circuit 220 may include a PMOS source follower, and may use the PMOS source follower to reduce the effect of transconductance of a transistor resulting from feedback by a tail current source.

In FIG. 2, a CS amplifier used in conventional track-and-hold devices may be replaced with the PMOS source follower. However, since the PMOS source follower is not an amplifier, no specific gain occurs. However, the PMOS source follower may reduce the effect of transconductance of a transistor generated due to feedback by a tail current source.

By connecting a power source (or GND) to a source, the PMOS source follower according to one embodiment may have a voltage amplification of less than 1 (about 0.9 to 0.99) and characteristics of high current amplification. In addition, the input and output at this time may be implemented in-phase.

The post linear circuit 210 according to one embodiment may be implemented by connecting two different PMOS transistors in a cascode structure.

More specifically, the post linear circuit 210 may be implemented with a structure in which the source nodes of two different PMOS transistors may be connected in series to an input resistance and the gate and drain nodes of each PMOS transistor are connected to each other. For example, the post linear circuit 210 may be implemented with a structure in which the gate and drain nodes of a first transistor are connected to each other and the gate and drain nodes of a second transistor are connected to each other.

The post linear circuit 210 implemented in this manner may reduce the nonlinear effect of a buffer by eliminating remaining transconductance.

That is, in the RF frequency band, the effect of transconductance still remains because it is difficult to sufficiently increase feedback loop gain. In this case, among linearization methods that have been used in low noise amplifiers, a post-linearization technique may be used to reduce the effect of nonlinearity of a buffer.

Meanwhile, in the sampling stage circuit 230, a source voltage ($V_{SS}$) may be supplied to a buffer stage circuit, and a NMOS transistor may be arranged so that a switch connected to a gate is connected to the source voltage ($V_{SS}$), and as a result, the NMOS transistor of a sampling stage may be turned off during hold operation. That is, the NMOS transistor of a sampling stage may be completely turned off at the time of holding, thereby minimizing signal distortion due to leakage current.

Figure 3:
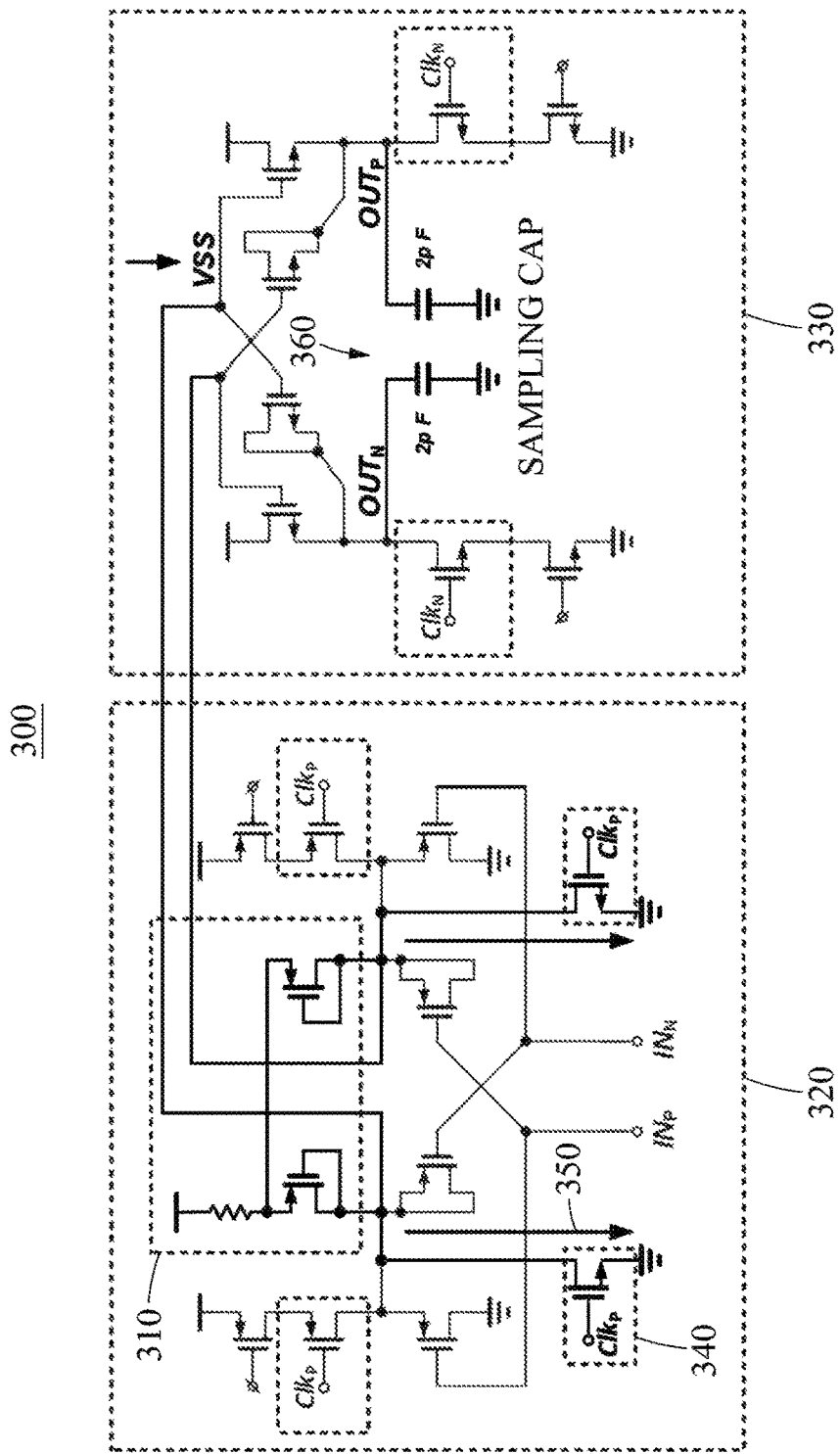
FIG. 3 is a circuit diagram for explaining operation of a track-and-hold device in a hold mode.

FIG. 3 is a circuit diagram for explaining operation of a track-and-hold device 300 in a hold mode in which buffer and sampling stage circuits 320 and 330 are involved.

The track-and-hold device 300 according to one embodiment may perform sampling of signals through electric current 350 in a track mode. In addition, when the track-and-hold device 300 is switched to a hold mode, the electric current 350 may be cut off. That is, when the track-and-hold device 300 is switched to a hold mode, a PMOS source follower may be completely turned off, thereby preventing a problem of hold-mode feedthrough.

The PMOS source follower of the track-and-hold device 300 may act as a buffer for input signals INn and INp instead of a CS amplifier and may generate voltages corresponding to the input signals.

In the process of preventing a problem of hold-mode feedthrough, a post linear circuit 310 may include two different PMOS transistors each having a gate and a drain connected to each other and a resistor, thereby blocking nonlinear signals generated in an RF frequency band.

In addition, the transistor corresponding to reference number 340 may block a tail current source fed back by track-and-hold operation by switching the tail current source.

In addition, as shown in reference number 360 of FIG. 3, distortion due to parasitic gate-source capacitance (Cgs) may be minimized through a cross-coupled circuit using transistors of the same type as a capacitor.

Therefore, the present disclosure enables accurate signal reconstruction while using a wider bandwidth in a software-defined radio (SDR), a RF radar, or the like. In addition, when the present disclosure is used, a simple receiver composed of an amplifier and an analog to digital convertor (ADC) that may be used in a broadband radar and 5G communication using a band of several GHz may be manufactured.

According to one embodiment, a track-and-hold device capable of performing sampling of input signals at high speed without distortion can be provided.

According to one embodiment, the effect of transconductance (Gm) of a transistor generated due to feedback by a tail current source can be reduced.

According to one embodiment, the nonlinear effect of a buffer can be reduced using a post-linearization technique.

According to one embodiment, when the track-and-hold device of the present disclosure is switched to a hold mode, a PMOS source follower can be completely turned off by blocking electric current, thereby preventing a problem of hold-mode feedthrough.

According to one embodiment, signal distortion due to leakage current can be reduced by connecting a switch connected to a gate to a source voltage ($V_{SS}$) in a sampling stage.

According to one embodiment, distortion caused by parasitic capacitance can be reduced through cross coupling using transistors of the same type as a capacitor.

The apparatus described above may be implemented as a hardware component, a software component, and/or a combination of hardware components and software components. For example, the apparatus and components described in the embodiments may be achieved using one or more general purpose or special purpose computers, such as, for example, a processor, a controller, an arithmetic logic unit (ALU), a digital signal processor, a microcomputer, a field programmable gate array (FPGA), a programmable logic unit (PLU), a microprocessor, or any other device capable of executing and responding to instructions. The processing device may execute an operating system (OS) and one or more software applications executing on the operating system. In addition, the processing device may access, store, manipulate, process, and generate data in response to execution of the software. For ease of understanding, the processing apparatus may be described as being used singly, but those skilled in the art will recognize that the processing apparatus may include a plurality of processing elements and/or a plurality of types of processing elements. For example, the processing apparatus may include a plurality of processors or one processor and one controller. Other processing configurations, such as a parallel processor, are also possible.

The software may include computer programs, code, instructions, or a combination of one or more of the foregoing, configure the processing apparatus to operate as desired, or command the processing apparatus, either independently or collectively. In order to be interpreted by a processing device or to provide instructions or data to a processing device, the software and/or data may be embodied permanently or temporarily in any type of a machine, a component, a physical device, a virtual device, a computer storage medium or device, or a transmission signal wave. The software may be distributed over a networked computer system and stored or executed in a distributed manner. The software and data may be stored in one or more computer-readable recording media.

Although the present disclosure has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

What is claimed is:

1. A high-speed track-and-hold device, comprising:
   a buffer stage circuit comprising a PMOS source follower and a post linear circuit; and
   a sampling stage circuit that is responsible for supplying a source voltage ($V_{SS}$) to the buffer stage circuit and that is arranged so that a switch connected to a gate is connected to the source voltage ($V_{SS}$) and a NMOS transistor of a sampling stage is turned off in hold operation.

2. The high-speed track-and-hold device according to claim 1, wherein the PMOS source follower blocks a tail current source fed back by track-and-hold operation by switching the tail current source.

3. The high-speed track-and-hold device according to claim 1, wherein the PMOS source follower acts as a buffer for input signals INn and INp instead of a CS amplifier and generates voltages corresponding to the input signals.

4. The high-speed track-and-hold device according to claim 1, wherein the post linear circuit comprises two different PMOS transistors each having a gate and a drain connected to each other and a resistor, thereby blocking nonlinear signals generated in an RF frequency band.

5. The high-speed track-and-hold device according to claim 1, further comprising a cross-coupled circuit comprising transistors of an identical type instead of a capacitor,
   wherein the cross-coupled circuit eliminates distortion caused by gate-source capacitance (Cgs).

* * * * *